United States Patent
Ryu et al.

(10) Patent No.: US 8,847,246 B2
(45) Date of Patent: *Sep. 30, 2014

(54) ORGANIC LIGHT EMITTING DIODE DISPLAY

(75) Inventors: Do-Hyung Ryu, Yongin (KR); Chun-Seok Ko, Yongin (KR); Kie Hyun Nam, Yongin (KR)

(73) Assignee: Samsung Display Co., Ltd. (KR)

( * ) Notice: Subject to any disclaimer, the term of this patent is extended or adjusted under 35 U.S.C. 154(b) by 789 days.

This patent is subject to a terminal disclaimer.

(21) Appl. No.: 13/087,288

(22) Filed: Apr. 14, 2011

(65) Prior Publication Data

US 2011/0291119 A1    Dec. 1, 2011

(30) Foreign Application Priority Data

May 28, 2010    (KR) ................. 10-2010-0050489

(51) Int. Cl.
*H01L 27/15* (2006.01)
*H01L 51/52* (2006.01)
*H01L 27/32* (2006.01)

(52) U.S. Cl.
CPC .......... *H01L 27/3276* (2013.01); *H01L 51/524* (2013.01); *H01L 51/5221* (2013.01)
USPC .................... 257/88; 257/E27.121

(58) Field of Classification Search
CPC ...................................... H01L 27/15
USPC ........................... 257/88, E27.121
See application file for complete search history.

(56) References Cited

U.S. PATENT DOCUMENTS 8,643,002 B2 *    2/2014    Ryu et al. .................... 257/40

FOREIGN PATENT DOCUMENTS

| JP | 2003-092192 A | 3/2003 |
| JP | 2008-016681 A | 1/2008 |
| KR | 1020060001712 | 1/2006 |
| KR | 1020060089977 A | 8/2006 |
| KR | 1020080108047 | 12/2008 |
| KR | 1020090030139 | 3/2009 |
| KR | 1020100047457 A | 5/2010 |

* cited by examiner

*Primary Examiner* — Marc Armand
(74) *Attorney, Agent, or Firm* — Knobbe Martens Olson & Bear LLP

(57) ABSTRACT

An organic light emitting diode display is disclosed. The organic light emitting diode display includes a base substrate including a display area and a non-display area around the display area, a plurality of pixels formed over the display area of the base substrate, the plurality of pixels including a common electrode, a common power line formed over the base substrate and electrically connected to a circuit of each of the plurality of pixels, an encapsulation substrate bonded to the base substrate by a sealing member surrounding the plurality of pixels, the encapsulation substrate including an inner surface facing the base substrate, a first conductive layer formed over the inner surface and electrically connecting the common power line to a first potential, and a second conductive layer formed over the inner surface and spaced apart from the first conductive layer, the second conductive layer electrically connecting the common electrode to a second potential.

27 Claims, 10 Drawing Sheets

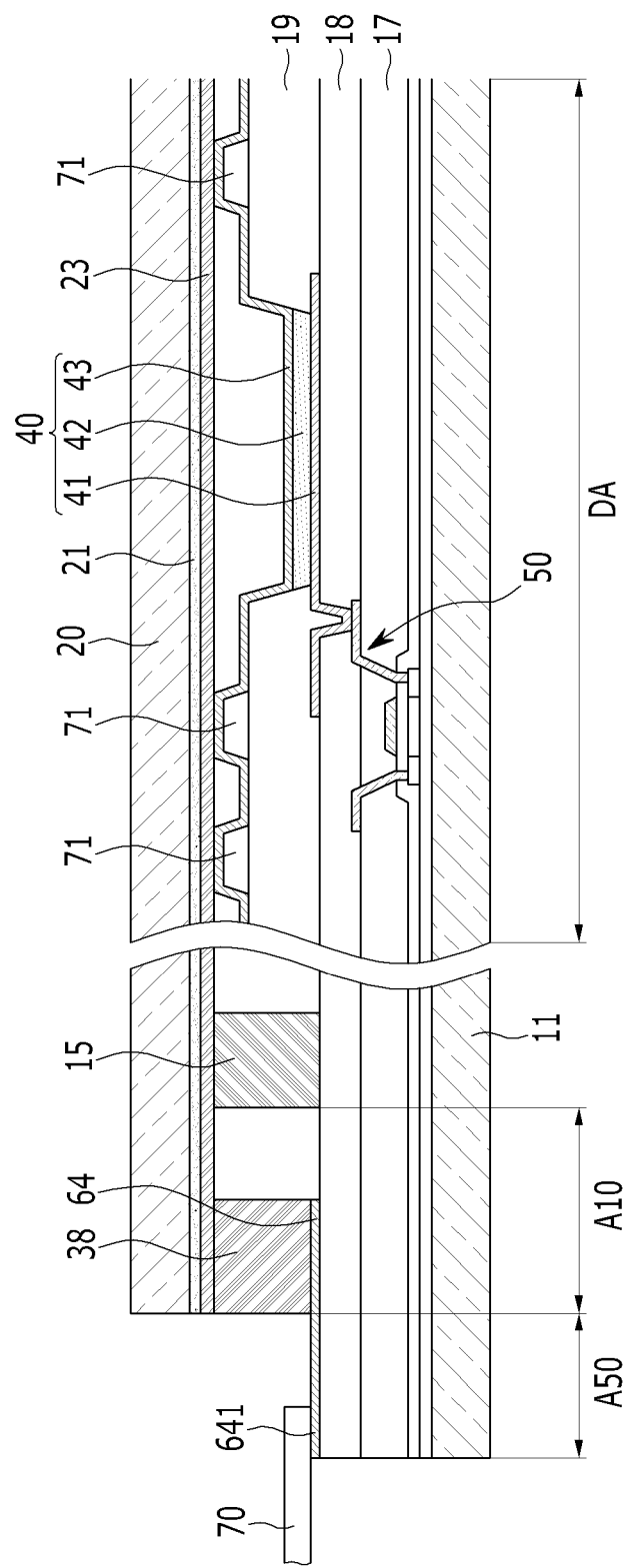

ORGANIC LIGHT EMITTING DIODE DISPLAY

CROSS-REFERENCE TO RELATED APPLICATIONS

This application claims priority to and the benefit of Korean Patent Application No. 10-2010-0050489 filed in the Korean Intellectual Property Office on May 28, 2010, the entire content of which is incorporated herein by reference.

BACKGROUND

1. Field

The described technology relates generally to an organic light emitting diode (OLED) display, and more particularly, to an organic light emitting diode display applying driving power to a common power line and a common electrode, using an encapsulation substrate.

2. Description of the Related Technology

An organic light emitting diode (OLED) display is a device that displays an image by having an organic light emitting diode that emits light by itself. Organic light emitting diode displays may have reduced thickness and weight, since they do not use an independent light source. Organic light emitting diode displays generally exhibit high-quality characteristics, such as low power consumption, high luminance, and high response speed.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an organic light emitting diode display which simplifies the manufacturing process, reduces dead spaces in a substrate and a product, and ensures uniform luminance of a screen while having a large area.

One aspect provides an organic light emitting diode display, which includes: i) a base substrate including a display area where a plurality of pixels including a common power line and a common electrode is formed, and a non-display area defined around the display area; ii) an encapsulation substrate bonded to the base substrate by a sealing member surrounding the display area; iii) a first conductive layer formed on one side of the encapsulation substrate facing the base substrate and connected to the common power line to applying driving power to the common power line; and iv) a second conductive layer spaced apart from the first conductive layer on one side of the encapsulation substrate facing the base substrate and connected to the common electrode to apply driving power to the common electrode.

The encapsulation substrate may be made of a carbon compound. The encapsulation substrate may include a resin matrix and a plurality of carbon fibers and the carbon fibers may be disposed to cross each other. Further, the encapsulation substrate may be composed of a plurality of layers, the layers may include a resin matrix and a plurality of carbon fibers, and the carbon fiber disposed at least one of the layers and the carbon fiber disposed on at least another layer of the layers may be disposed to cross each other.

An insulating layer may be formed on one side of the encapsulation substrate which faces the base substrate, and the first conductive layer and the second conductive layer are positioned on the insulating layer. The first conductive layer and the second conductive layer may be formed of an aluminum layer or a copper layer.

The first conductive layer may be formed along three edges of the encapsulation substrate, facing the non-display area. The common power line may extend to the non-display area to form a common power pad and a first conductive member may be positioned between the first conductive layer and the common power pad. The first conductive member may be formed of a conductive sealing material at the same height as the sealing member.

The second conductive layer may face the sealing member and the internal region of the sealing member, the common electrode may have a convexo-concave structure, and the prominences of the common electrode may contact the second conductive layer. A plurality of spacers may be disposed under the common electrode and the common electrode may have a plurality of prominences corresponding to the spacers.

Another aspect provides an organic light emitting diode display, which includes: i) a base substrate including a display area where a plurality of pixels is formed, a first wire region to a fourth wire region that are disposed around four edges of the display area, and a pad region disposed around the first wire region; ii) a common power line formed in the display area and extending to the second wire area to the fourth wire area to be connected with a common power pad; iii) a common electrode formed in the display are and having a plurality of prominences; iv) an encapsulation substrate bonded to the base substrate by a sealing member surrounding the display area and made of a carbon compound; v) a first conductive layer formed on one side of the encapsulation substrate facing the base substrate to face the second wire region to the fourth wire region, and connected with the common power pad by a first conductive member; and vi) a second conductive layer spaced apart from the first conductive layer on one side of the encapsulation substrate facing the base substrate, in close contact with the prominences of the common electrode.

The encapsulation substrate may include a resin matrix and a plurality of carbon fibers and the carbon fibers may be disposed to cross each other. Further, the encapsulation substrate may be composed of a plurality of layers, the layers may include a resin matrix and a plurality of carbon fibers, and the carbon fiber disposed at least one of the layers and the carbon fiber disposed on at least another layer of the layers may be disposed to cross each other.

An insulating layer may be formed on one side of the encapsulation substrate which faces the base substrate, and the first conductive layer and the second conductive layer may be positioned on the insulating layer.

The pixel may include a thin film transistor and the thin film transistor may include a semiconductor layer, a gate electrode disposed on the semiconductor layer with a gate insulating layer therebetween, and source and drain electrodes disposed on the gate electrode with an interlayer insulating layer therebetween The common power line may be made of the same material on the same layer as any one of the gate electrode, the source electrode, and the drain electrode.

The pixel may include an organic light emitting diode and the organic light emitting diode may include a pixel electrode disposed on a planarization layer and exposed by a first opening of a pixel defining layer, and an organic emission layer filled in the first opening. The common electrode may cover the pixel defining layer and the light emission layer.

At least one of the gate insulating layer, the interlayer insulating layer, and the planarization layer may extend to the second wire region to the fourth wire region and covers the common power line.

At least one of the gate insulating layer, the interlayer insulating layer, and the planarization layer may forms a second opening that exposes the common power line, and an end of the common power line exposed by the second opening may form the common power pad. Further, a pad conductive layer connected with the common power line by the second opening may be formed on at least one of the gate insulating layer, the interlayer insulating layer, and the planarization layer, such that the common power pad is formed.

The pad conductive layer may be made of the same material on the same layer as the pixel electrode. The spacers may be formed on the pixel defining layer and the common electrode may have a plurality of prominences corresponding to the spacers.

The common power line may include a first common power line and a second common power line perpendicular to the first common power line. Both ends of the first common power line may extend to the second wire region and the fourth wire region, and one end of the second common power line may extend to the third wire region.

A common power supply line may be formed inside the sealing member. The other end of the second common power line may be connected to the common power supply line, and the common power supply line may be connected to a first pad electrode in the pad region.

The first conductive member may extend to the edge of the first conductive layer which faces the pad region, a first inner wire layer overlapping the first conductive layer may be formed on the base substrate, and the first inner wire layer may be connected to a second pad electrode in the pad region.

Further, the second conductive member may be positioned between the first conductive layer and the base substrate at the edge of the first conductive layer which faces the pad region, and the first inner wire layer may be formed on the base substrate corresponding to the second conductive member. The first inner wire layer may be connected with the second pad electrode in the pad region.

The second conductive layer may face the first wire region, the sealing member, and the display area. The second inner wire layer may be formed in the first wire region on the base substrate and a third conductive member may be positioned between the second inner wire layer and the second conductive layer. The second inner wire layer may be connected with the third pad electrode in the pad region.

According to certain embodiments, since the pad region attached to a flexible printed circuit (FPC) is positioned at any one edge of the base substrate, it is possible to simplify the entire structure and reduce a dead space of the base substrate and a dead space of the product. Further, it is possible to reduce the manufacturing cost by reducing the number of flexible printed circuit (FPC) and printed circuit board (PCB) which are used in the organic light emitting diode display. Since it is possible to uniformly apply driving power to the pixels through the four wire regions surrounding the display region, it is possible to ensure luminance uniformity of the display region even if the organic light emitting diode display has a large area.

One aspect is an organic light emitting diode display, including: a base substrate including a display area and a non-display area around the display area, a plurality of pixels formed over the display area of the base substrate, the plurality of pixels including a common electrode, a common power line formed over the base substrate and electrically connected to a circuit of each of the plurality of pixels, an encapsulation substrate bonded to the base substrate by a sealing member surrounding the plurality of pixels, the encapsulation substrate including an inner surface facing the base substrate, a first conductive layer formed over the inner surface and electrically connecting the common power line to a first potential, and a second conductive layer formed over the inner surface and spaced apart from the first conductive layer, the second conductive layer electrically connecting the common electrode to a second potential.

The encapsulation substrate may include a material made of a carbon compound.

The encapsulation substrate may include a resin matrix and a plurality of carbon fibers, and the carbon fibers may be disposed to cross each other.

The encapsulation substrate may include a plurality of stacked layers, which may include a first layer and a second layer, the first layer including a resin matrix and a plurality of carbon fibers aligned generally in a first direction, the second layer including a resin matrix and a plurality of carbon fibers aligned generally in a second direction crossing the first direction.

An insulating layer may be formed between the inner surface and the first conductive layer and further between the inner surface and the second conductive layer.

The first conductive layer may include an aluminum layer or a copper layer, and the second conductive layer may include an aluminum layer or a copper layer.

The inner surface of the encapsulation substrate may generally be rectangular, the first conductive layer may be formed along three edges of the inner surface.

The common power line may be electrically connected to the first conductive layer via a common power pad and a first conductive member.

The first conductive member may include a conductive sealing material and may be interconnecting the base substrate and the encapsulation substrate along with the sealing member.

The common electrode may have a convexo-concave structure including a plurality of prominences facing the second conductive layer, where at least part of the prominences of the convexo-concave structure may contact the second conductive layer.

The base substrate may include a plurality of spacers, which may correspond to the plurality of prominences of the common electrode.

Another aspect is an organic light emitting diode display, including: a base substrate including a non-display area and a display area, where the non-display area includes a first wire region, a second wire region, a third wire region and a fourth wire region, each of which is extending along an edge of the display area, where the non-display area further includes a pad region along the first wire region, a plurality of pixels formed in the display area of the base substrate a common power line formed in the display area of the base substrate, the common power line extending between the second wire region and the fourth wire region generally opposing the second wire region, a common electrode formed in the display area of the base substrate and having a plurality of prominences, an encapsulation substrate bonded to the base substrate by a sealing member surrounding the display area, the encapsulation substrate including a carbon compound, the encapsulation substrate including an inner surface facing the base substrate, a first conductive layer formed over the inner surface in the second wire region, in the third wire region and in the fourth wire region, the first conductive layer electrically connected to the common power line, and a second conductive layer formed over the inner surface and spaced apart from the first conductive layer, the second conductive layer electrically contacting at least part of the prominences of the common electrode.

The encapsulation substrate may include a resin matrix and a plurality of carbon fibers, and the carbon fibers may be disposed to cross each other.

The encapsulation substrate may include a plurality of stacked layers, which may include a first layer and a second layer, the first layer including a resin matrix and a plurality of carbon fibers aligned generally in a first direction, the second layer including a resin matrix and a plurality of carbon fibers aligned generally in a second direction crossing the first direction.

An insulating layer may be formed between the inner surface and the first conductive layer and further between the inner surface and the second conductive layer.

Each pixel of the plurality of pixels may include a thin film transistor, where the thin film transistor may include a semiconductor layer, a gate electrode disposed on the semiconductor layer with a gate insulating layer therebetween, and source and drain electrodes disposed on the gate electrode with an interlayer insulating layer therebetween.

The common power line may include the same material as at least one of the gate electrode, the source electrode, and the drain electrode.

Each of the pixels in the plurality of pixels may include an organic light emitting diode, where the organic light emitting diode may include a pixel electrode and an organic emission layer, and where the organic emission layer may be interposed between the common electrode and the pixel electrode.

The base substrate may further include a gate insulating layer, an interlayer insulating layer, a planarization layer, at least one of which may extend into the non-display area overlapping with one of the second wire region, the third wire region and the fourth wire region when viewed in a direction perpendicular to the inner surface, and where the at least one of the gate insulating layer, the interlayer insulating layer, and the planarization layer covers at least part of the common power line.

The common power line may be electrically connected to the first conductive layer via a wiring that extends in a direction substantially perpendicular to the inner surface, where the wiring may includes a common power pad that passes through at least one of the gate insulating layer, the interlayer insulating layer, and the planarization layer.

The organic light emitting diode display may further include: a pixel defining layer interposed between two immediately neighboring ones of the plurality of pixels, at least one spacer protruding from the pixel defining layer toward the encapsulation substrate, and the common electrode may cover the pixel defining layer and follow the contour of the at least one spacer to provide at least one prominence.

The common power line may include a first common power line and a second common power line substantially perpendicular to the first common power line, and opposing ends of the first common power line may extend into the second wire region and the fourth wire region respectively, and one end of the second common power line may extend into the third wire region.

A common power supply line may be formed in a region surrounded by the sealing member, and the other end of the second common power line may be electrically connected to the common power supply line, and the common power supply line may be connected to a first pad electrode in the pad region.

A first conductive member may extend to an edge of the first conductive layer which faces the pad region, a first inner wire layer overlapping the first conductive layer may be formed on the base substrate, and the first inner wire layer may be connected to a second pad electrode in the pad region.

A second conductive member may be positioned between the first conductive layer and the base substrate at the edge of the first conductive layer which faces the pad region, the first inner wire layer may be formed on the base substrate along the second conductive member, and the first inner wire layer may be connected with the second pad electrode in the pad region.

The second conductive layer may face the first wire region, the sealing member, and the display area.

A second inner wire layer may be formed in the first wire region on the base substrate, a third conductive member may be positioned between the second inner wire layer and the second conductive layer, and the second inner wire layer may be connected with a third pad electrode in the pad region.

BRIEF DESCRIPTION OF THE DRAWINGS

FIG. 3 is a top plan view showing a base substrate in the embodiment of the organic light emitting diode display shown in FIG. 2;

FIG. 7 is a cross-sectional view taken along line V-V of FIG. 2;

DETAILED DESCRIPTION OF CERTAIN INVENTIVE EMBODIMENTS

Figure 1:
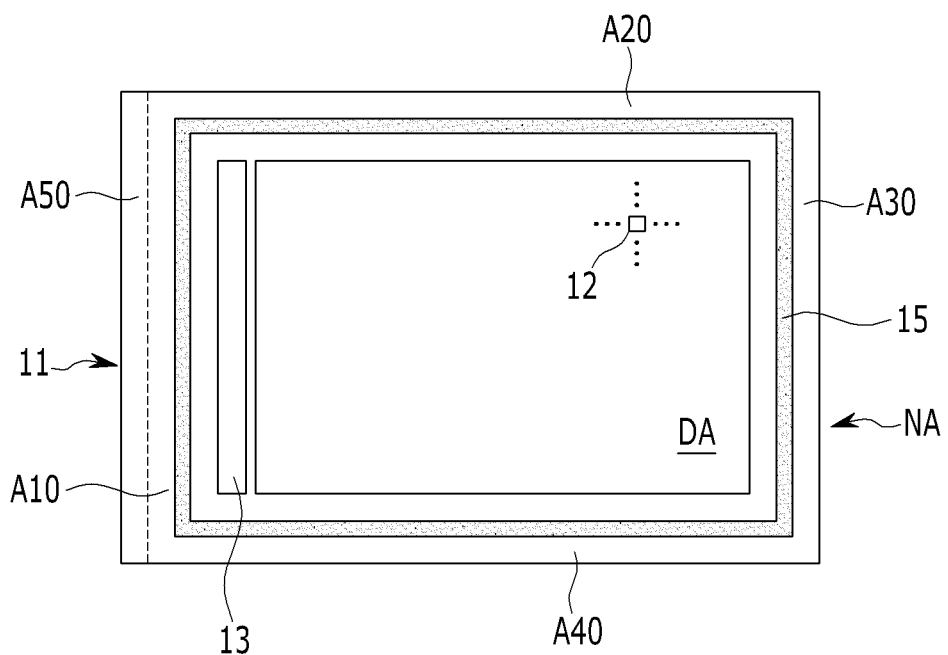
FIG. 1 is a top plan view schematically showing the structure of an embodiment of an organic light emitting diode display.

Organic light emitting diode displays include a display area and a non-display area around the display area. The non-display area may be divided into a sealing area where a sealing member is disposed, a wire region where various wires are disposed, and a pad region where pad electrodes extending from the wires are disposed. A chip-on film (COF) or a flexible printed circuit (FPC) is mounted in the pad regions to apply driving power to the organic light emitting diode. The chip-on film (COF) and the flexible printed circuit (FPC) are connected to a printed circuit board (PCB).

The larger the area of the organic light emitting diode displays, the more likely for the luminance non-uniformity to increase, because organic light emitting diodes are typically supplied with driving power from pad regions at four edges, that is, upper, lower, left, and right edges, of the substrate. The structures of organic light emitting diode displays are typically complicated, and the number of parts, including the chip-on film (COF), flexible printed circuit (FPC), and printed circuit board (PCB), increases, thereby increasing the manufacturing cost.

With pad regions defined at all four edges of the substrate, a dead space (the width of the non-display area that does not contribute to display) of the substrate increases and the dead space further increases, when the printed circuit board (PCB) is disposed in parallel with the substrate.

Hereinafter, embodiments will be described more fully hereinafter with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals generally designate like elements throughout the specification. The size and thickness of each component shown in the drawings are shown for understanding and ease of description, but embodiments are not limited thereto.

It will be understood that when an element such as a layer, film, region, or substrate is referred to as being "on" another element, it can be directly on the other element or intervening elements may also be present.

FIG. 1 is a top plan view schematically showing the structure of an embodiment of an organic light emitting diode display.

Referring to FIG. 1, an organic light emitting diode display 100 of an embodiment includes a base substrate 11 divided into a display area DA and a non-display area NA. A plurality of pixels 12 is formed in the display area DA of the base substrate 11 to display images, and one or more drivers 13 may be disposed in the non-display area NA. In some embodiments, the drivers may not be formed in the non-display area NA, and some or all of them may be removed.

A sealing member 15 is disposed in the non-display area NA to bond the base substrate 11 with the encapsulation substrate (not shown). When the driver 13 is formed in the non-display area NA, the sealing member 15 surrounds the display area DA and the driver 13. The sealing member 15 may be made of a thermosetting resin, such as for example, epoxy resin.

The non-display area NA includes four wire regions A10-A40 around the sealing member 15, and a pad region A50 outside one of the wire regions. In the embodiment shows, the wire region A1-A40 includes first to fourth wire regions A10, A20, A30 and A40 corresponding to the sides of the sealing member 15, respectively, and the pad region A50 contacts the first wire region A10.

The pad region A50 is not formed at the four edges of the base substrate 11, but formed only at any one edge of the base substrate 11. A chip-on film (COF) or a flexible printed circuit (FPC) (not shown) may be attached to the pad region A50 to apply driving power to the pixels 12 in the display area DA. The chip-on film (COF) and the flexible printed circuit (FPC) may be connected to a printed circuit board (PCB) (not shown).

With the pad region A50 positioned at any one edge of the base substrate 11, it is possible to simplify the structure of the organic light emitting diode display 100 and effectively reduce a dead space (the width of the non-display area NA) of the base substrate 11 and a dead space of the display device. It is also possible to reduce the manufacturing costs by decreasing the number of chip-on film (COF), flexible printed circuits (FPC), and/or printed circuit boards (PCB) used.

In embodiments of the organic light emitting diode display 100, it is possible to uniformly apply driving power to the pixels 12 through the four wire regions A10-A40 surrounding the display region DA, even though the pad region A50 is formed at only one edge of the base substrate 11. It is thus possible to increase the display area of the organic light emitting diode display 100 and ensure luminance uniformity over the display area DA. The luminance uniformity may be achieved by a power supply structure using an encapsulation substrate, which is described below.

Figure 2:
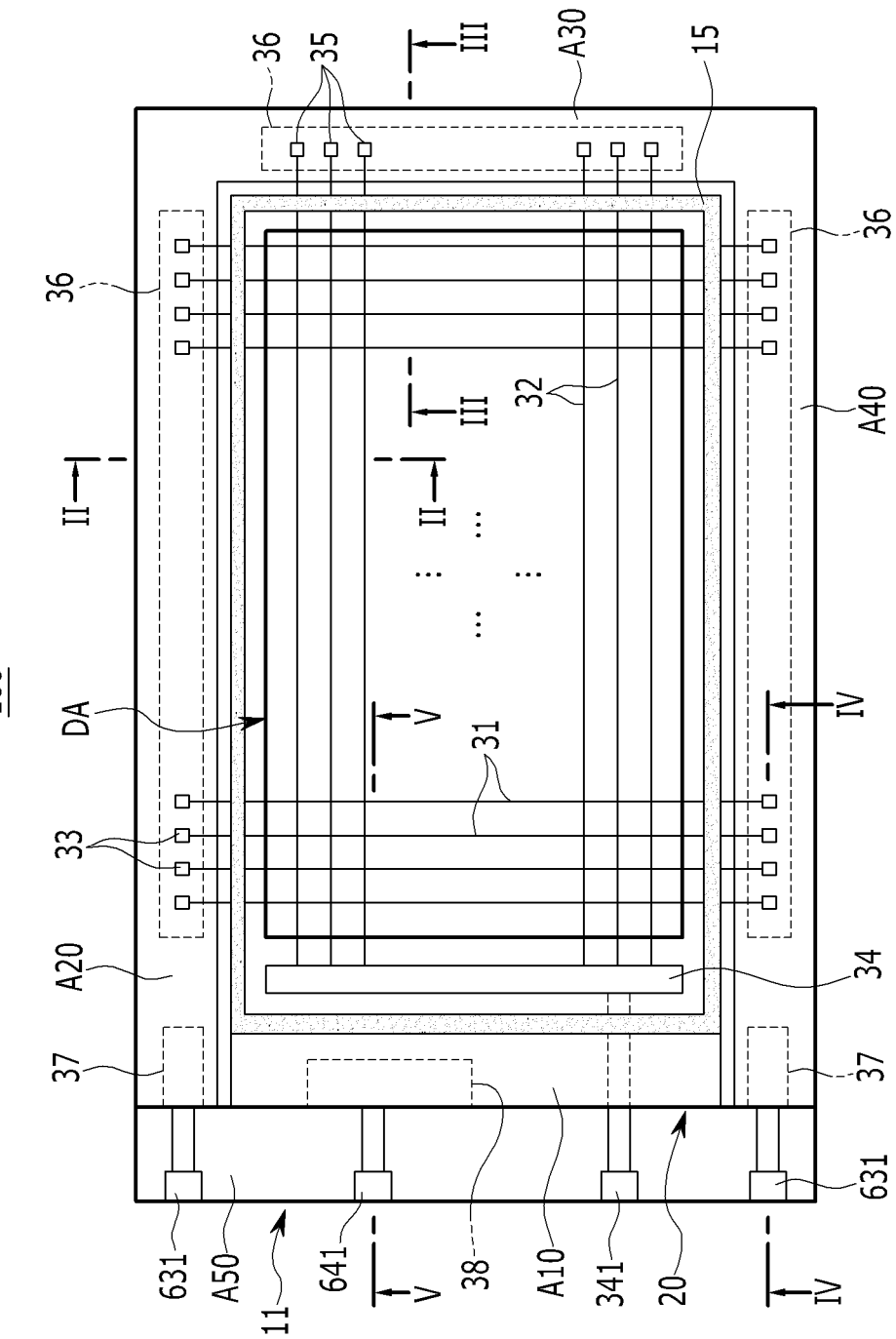
FIG. 2 is a top plan view showing the structure of an embodiment of an organic light emitting diode.
Figure 3:
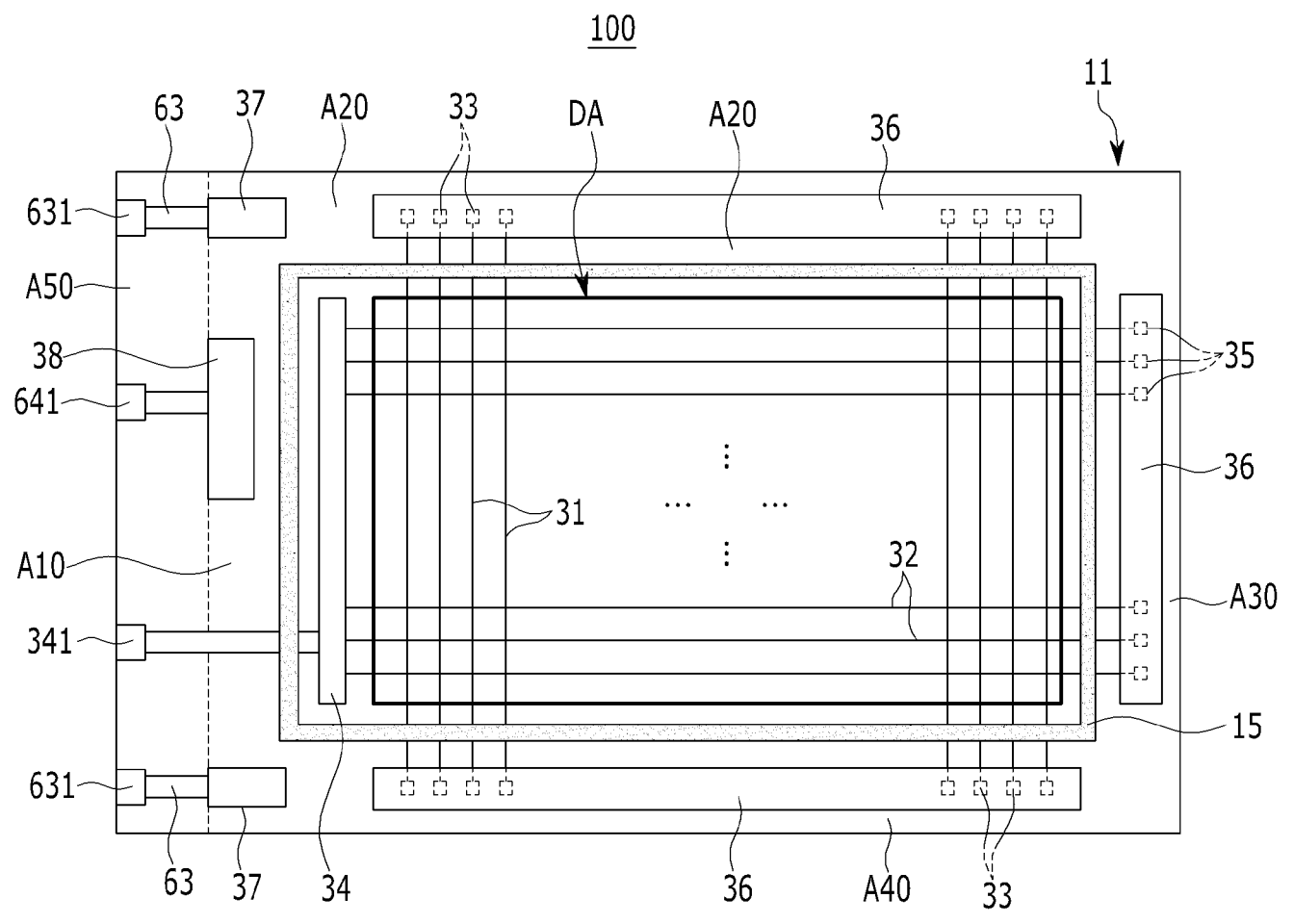
Figure 4A:
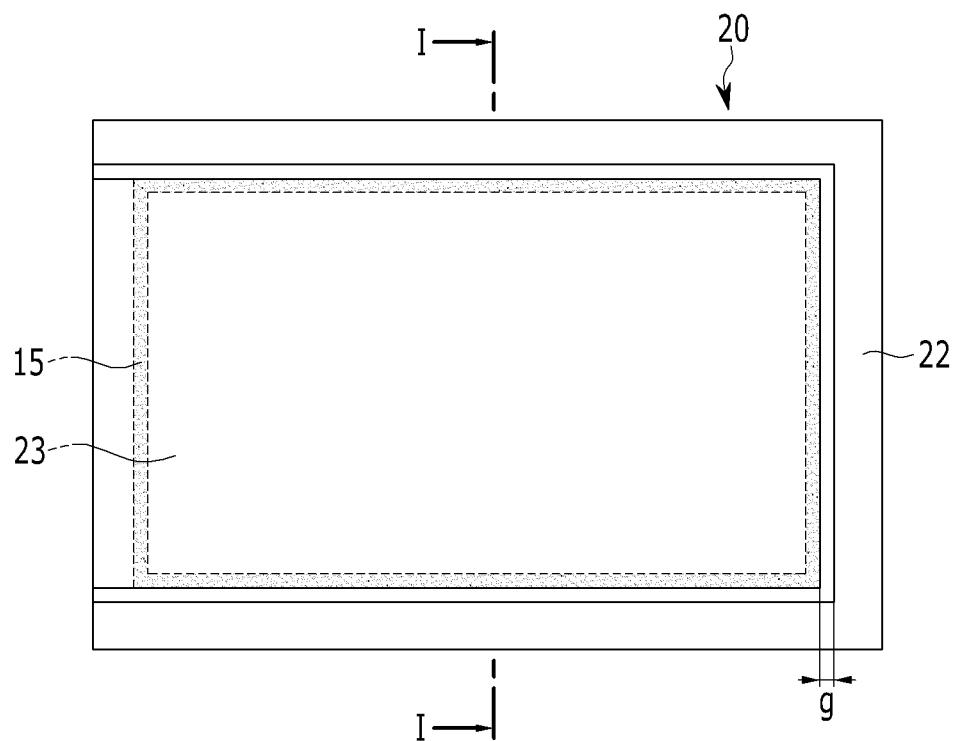
FIG. 4A is a top plan view showing an encapsulation substrate of the organic light emitting diode display shown in FIG. 2.
Figure 4B:
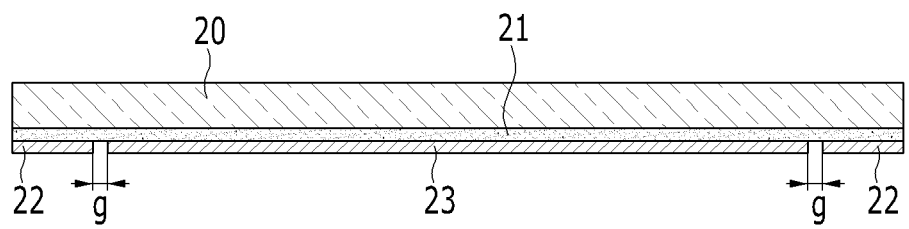
FIG. 4B is a cross-sectional view taken along line I-I of FIG. 4A.

FIG. 2 is a top plan view showing the structure of an embodiment of an organic light emitting diode display, FIGS. 3 and 4A are top plan views showing the base substrate and the encapsulation substrate in the organic light emitting diode display shown in FIG. 2, respectively, and FIG. 4B is a cross-sectional view taken along line I-I of FIG. 4A.

Referring to FIGS. 4A and 4B, the organic light emitting diode display 100 includes an encapsulation substrate 20 bonded to the base substrate by the sealing member 15. The encapsulation substrate 20 may be formed to have a size covering the display area DA and the non-display area NA, except for the pad region 50. The encapsulation substrate 20 may cover all of the first to the fourth wire regions A10-A40. The encapsulation substrate 20 covers the pixels 12 inside the sealing member 15 and the driver (not shown) to shield them from oxygen and water penetrating from the outside.

The encapsulation substrate 20 may be made of a carbon composite. The encapsulation substrate 20 made of a carbon composite has a thermal expansion coefficient close to that of the base substrate 11, particularly a base substrate 11 made of glass or plastic. Accordingly, when the base substrate 11 and the encapsulation substrate 20 are bonded by hardening the sealing member 15 a high temperature, it is possible to effectively prevent bending due to a difference in thermal expansion coefficients. It is also possible to prevent bending caused in an environmental reliability test after bonding.

An insulation layer 21 may be formed on a side of the encapsulation substrate 20 which faces the base substrate 11, and a first conductive layer 22 and a second conductive layer 23 may be formed on the insulation layer 21. The first conductive layer 22 may be a wire layer electrically connected with a common power line, which is described below, to apply driving power to the common power line. The second conductive layer 23 may be a wire layer contacting a common electrode (cathode or electron injection electrode), which is described below, to apply driving power to the common electrode.

The first conductive layer 22 and the second conductive layer 23 may be positioned at a predetermined distance "g" from each other, to prevent a short-circuit therebetween. In embodiments where the encapsulation substrate 20 is made of a carbon composite, the encapsulation substrate itself has conductivity, such that the first conductive layer 22 and the second conductive layer 23 may be short-circuited without an insulating layer. Such a short-circuit is prevented by forming the insulation layer 21 before forming the first conductive layer 22 and the second conductive layer 23 on the encapsulation substrate 20.

The first conductive layer 22 may be formed at three edges of the encapsulation substrate 20, and may be continuously formed with a predetermined width along the edges. In some embodiments, the first conductive layer 22 contacts the three edges of the encapsulation substrate 20, in a U-shape. The second conductive layer 23 may be formed in the other region on the encapsulation substrate 20, at a predetermined distance from first conductive layer 22. The second conductive layer 23 may be formed at the center portion on the encapsulation substrate 20, contacting the fourth edge of the encapsulation substrate 20.

In this configuration, the second conductive layer 23 faces the first wire region A10 (see FIG. 1) contacting the pad region A50 (see FIG. 1), the sealing member 15, and the inner side of the sealing member 15 in the thickness direction of the encapsulation substrate 20, and the first conductive layer 22 faces the second to the fourth wire region A20-A40 (see FIG. 1). The first conductive layer 22 and the second conductive layer 23 may be formed of a metal layer, for example, an aluminum layer or a copper layer, which has high conductivity and waterproof effect.

Referring to FIGS. 2 and 3, a plurality of first common power lines 31 and a plurality of second power lines 32 perpendicular to the first common lines 31 may be formed in the display area DA. At least one driver (not shown) may be positioned between the display area DA and the sealing member 15.

Both ends of the first common power line 31 extend outside the display area DA, and a first common power pad 33 is formed in the second wire region A20 and the fourth wire region A40. Both ends of the second common power line 32 also extend outside the display area DA, in which one end of the second power line 32 is connected to a common power supply line 34 inside the sealing member 15 and the other end extends to the third wire region A30, and a second common power pad 35 is formed in the third wire region A30.

The first common power line 31 and the second common power line 32 may be covered with an insulation layer (not shown). In some embodiments, the first common power pad 33 and the second common power pad 35 may be defined as the portions where the first common power line 31 and the second common power line 32 are exposed by openings formed in the insulation layer. In other embodiments, the common power pads may be defined as conductive layers on the insulation layer electrically connected with the first common power line 31 or the second common power line 32 through the openings in the insulation layer. The detailed structure of the first and second common power pads 33, 35 is described below.

The common power supply line 34 may be directly connected to a first pad electrode 341 formed in the pad region A50. Driving power may be applied to one end of the second common power line 32 from a flexible printed circuit (not shown) attached to the pad region A50 through the first pad electrode 341 and the common power supply line 34.

The first common power pad 33 and the second common power pad 35 may not be connected with the pad electrode 341. The common power pads 33 and 35 may be connected with the flexible printed circuit (not shown) of the pad region A50 through the first conductive layer 22 formed on the encapsulation substrate 20. Therefore, driving power may be applied to the other end of the second common power line 32 and both ends of the first common power line 31 from the flexible printed circuit through the first conductive layer 22. Embodiments of the organic light emitting diode display 100 may thus apply driving power to the first and second common power lines 31, 32 in all four directions.

Figure 5A:
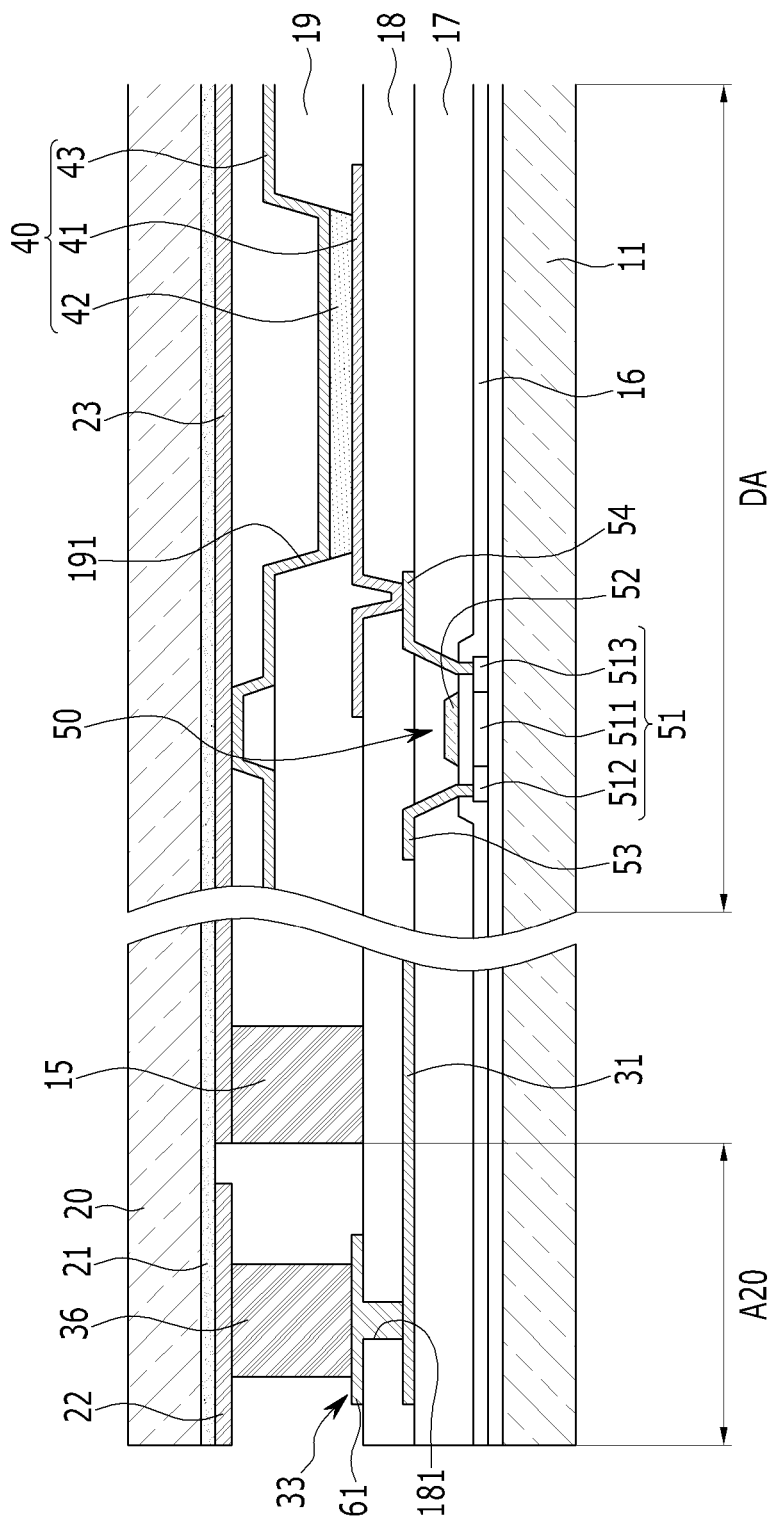
FIG. 5A is a cross-sectional view taken along line II-II of FIG. 2.
Figure 5B:
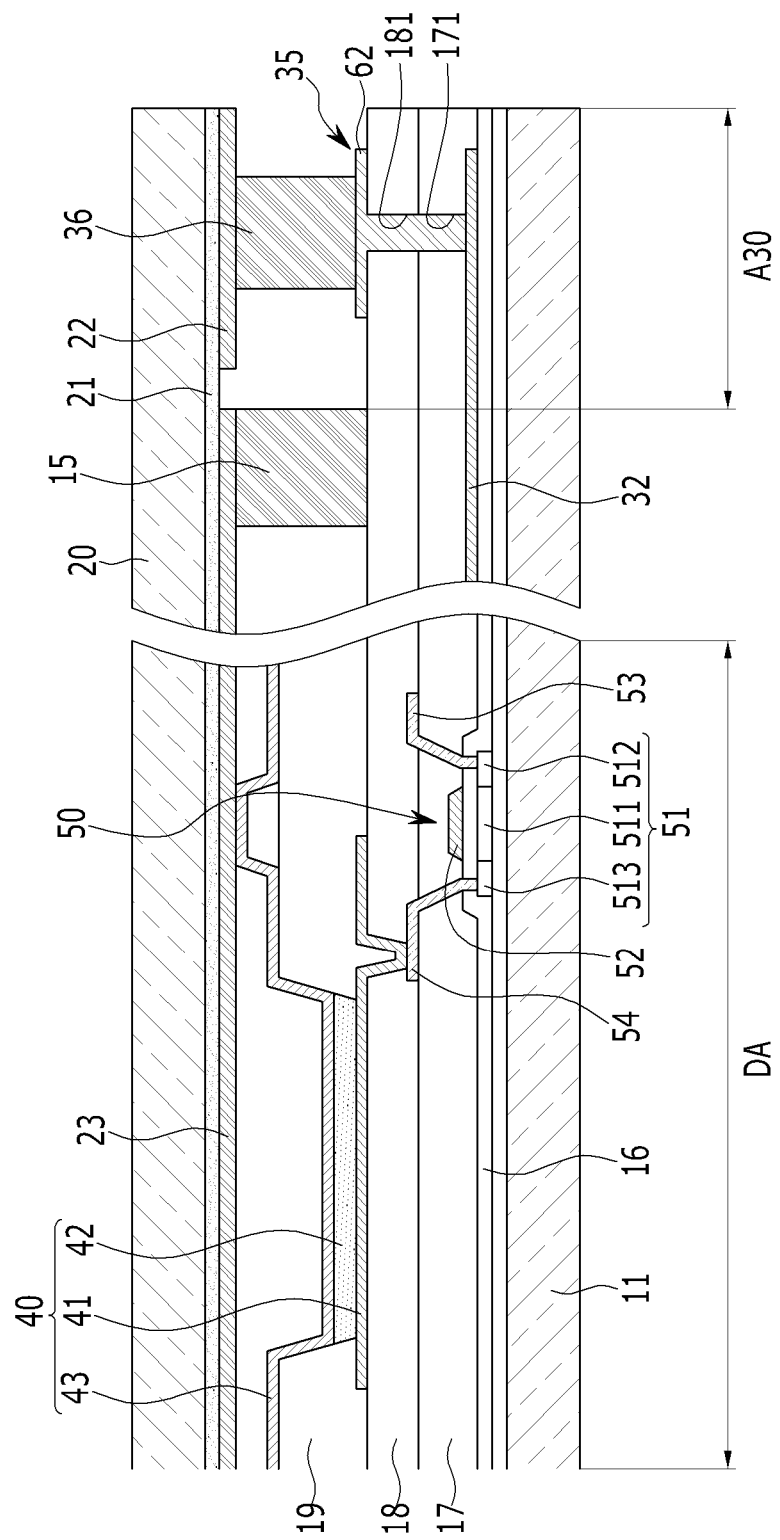
FIG. 5B is a cross-sectional view taken along line of FIG. 2.

FIG. 5A is a cross-sectional view taken along line II-II of FIG. 2 and FIG. 5B is a cross-sectional view taken along III-III line of FIG. 2.

Referring to FIGS. 5A and 5B, a first conductive member 36 may be formed between the first conductive layer 22 and the first common power pad 33, and between the first conductive layer 22 and the second common power pad 35. The first conductive members 36 may be made of a conductive sealing material, at substantially the same height as the sealing member 15. The first conductive members 36 function as conductive paths connecting the first conductive layer 22 with the first and second common power pads 33, 35 and also firmly fixing the first conductive layer 22 and the first and second common power pads 33, 35.

In some embodiments, the first conductive members 36 may have a rod shape or a U-shape, similar to the first conductive layer 22, in a plan view. The first conductive members 36 may be separated in the second to the fourth wire region A20-A40.

An organic light emitting diode 40 and a driving circuit may be formed in each pixel 12 in the display area DA. The driving circuit may be composed of at least two thin film transistors including a switching thin film transistor and a driving thin film transistor, and at least one capacitor.

FIGS. 5A and 5B schematically show one thin film transistor 50 and one organic light emitting diode 40 disposed in the display area DA. The cross section of the display area DA taken along the line II-II of FIG. 2 and the cross section of the display area DA taken along the line III-III of FIG. 2 are practically different, but for better understanding and ease of description, the display areas DA are shown in similar configuration in FIGS. 5A and 5B.

The first common power line 31 and the second common power line 32 may be made of the same material and at the same layer as any one of the electrodes of the thin film transistor 50. At least one of the insulation layers in the display area DA may cover the first common power line 31 and the second common power line 32, extending outside the sealing member 15.

The thin film transistor 50 may include a semiconductor layer 51, a gate electrode 52, a source electrode 53, and a drain electrode 54. The semiconductor layer 51 may be made of polysilicon layer and include a channel region 511, a source region 512, and a drain region 513. The channel region 511 may be an intrinsic semiconductor without impurities, and the source region 512 and the drain region 513 may be impurity semiconductors doped with impurities.

The gate electrode 52 may be disposed on the channel region 511 of the semiconductor layer 51, with the gate insulating layer 16 therebetween. The source electrode 53 and drain electrode 54 may be disposed on the gate electrode 52 with an interlayer insulating layer 17 therebetween, and may be connected to the source area 512 and the drain area 513 through contact holes formed through the interlayer insulating layer 17, respectively. A planarization layer 18 may be formed on the source electrode 53 and the drain electrode 54, and a pixel electrode 41 may be formed on the planarization layer 18.

The pixel electrode 41 may be formed on the source electrode 53 and drain electrode 54 with the planarization layer 18 therebetween and may be connected with the drain electrode 54 through a contact hole of planarization layer 18. A pixel defining layer 19 may be disposed on the pixel electrode 41 and the planarization layer 18 and have a first opening 191 for each pixel to expose a portion of the pixel electrode 41. An organic emission layer 42 may be formed on the exposed pixel electrode 41 and a common electrode 43 may be formed over the entire display area DA to cover the organic emission layer 42 and the pixel defining layer 19. The organic light emitting diode 40 may be composed of the pixel electrode 41, the organic emission layer 42, and the common electrode 43.

The pixel electrode 41 may be a hole injection electrode (anode electrode) and the common electrode 43 may be an electron injection electrode (cathode electrode). In some embodiments, the organic emission layer 42 may be composed of a hole injection layer (HIL), a hole transport layer (HTL), an emission layer, an electron transport layer (ETL), and an electron injection layer (EIL), which are sequentially stacked from the pixel electrode 41. In some embodiments, at least one of the layers, except for the emission layer, may be removed. Holes and electrons are injected into the organic emission layer 42 from the pixel electrode 41 and the common electrode 43 and light is emitted when excitons produced by combination of the injected holes and electrons drops to the ground state from the excited state.

The pixel electrode 41 may be formed of a transmissive conductive layer and the common electrode 43 may be formed of a reflective conductive layer. In some embodiments, light emitted from the organic emission layer 42 is reflected from the common electrode 43 and travels outside through the base substrate 11. This light emission structure is known as a bottom emission type.

In some embodiments, the pixel electrode 41 may include any one of ITO (indium tin oxide), IZO (indium zinc oxide), $In_2O_3$ and ZnO. In other embodiments, the pixel electrode 41 may be formed in a metal mirror type having a reflective conductive layer interposed between two transmissive conductive layers. In some embodiments, the pixel electrode 41 may comprise a triple layer of ITO/Ag/ITO. In such embodiments, it may be possible to increase luminous efficiency by confining some of the light emitted from the organic emission layer 42 between the pixel electrode 41 and the common electrode 43. The common electrode 43 may include any one of silver (Ag), aluminum (Al), a silver alloy, and an aluminum alloy.

The first common power line 31 and the second common power line 32 may be formed on the same layer as any one of the gate electrode 52, and source/drain electrodes 53, 54. In the embodiment of FIG. 5A, the first common power line 31 is made of the same material and at the same layer as the source/drain electrodes 53, 54. In the embodiment of FIG. 5B the second common power line 32 is made of the same material and at the same layer as the gate electrode 52.

The gate insulating layer 16, interlayer insulating layer 17, planarization layer 18 may extend outside the sealing member 15. In some embodiments, the end of the first common power line 31, which is positioned in the second wire region A20 and the fourth wire region A40, may be covered by the planarization layer 18, and the end of the second common power line 32, which is positioned in the third wire region A30, may be covered by the interlayer insulating layer 17 and the planarization layer 18.

The planarization layer 18 may have a second opening 181 in the second wire region A20 and the fourth wire region A40 to expose the end of the first common power line 31. The first common power pad 33 may be defined at the end of the first common power line 31 which is exposed by the second opening 181. The pad conductive layer 61 electrically connected with the first common power line 31 through the second opening 181 may be formed on the planarization layer 18. In some embodiments, the first common power pad 33 may be defined at the first pad conductive layer 61.

The interlayer insulating layer 17 and planarization layer 18 have second openings 171, 181 in the third wire region A30 to expose the end of the second common power line 32. The second common power pad 35 may be defined as the end of the second common power line 32 which is exposed by the second openings 171, 181. The second pad conductive layer 62 electrically connected with the second common power line 32 through the second openings 171, 181 may be formed on the planarization layer 18. In some embodiments, the second common power pad 35 may be defined as the second pad conductive layer 62.

In some embodiments, he first pad conductive layer 61 and the second pad conductive layer 62 may be made of the same material simultaneously with any one of the pixel electrode 41 and the common electrode 43. Accordingly, an independent patterning for forming the first and second pad conductive layers 61, 62 can be omitted, such that the manufacturing process may be simplified. In some embodiments, the first and second pad conductive layers 61, 62 may be made of the same material as the pixel electrode 41, such as, for example, in a triple layer of ITO/Ag/ITO.

Figure 6A:
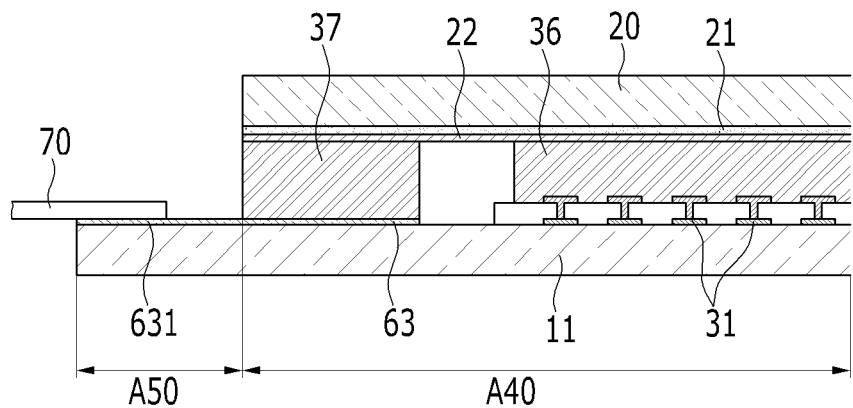
FIG. 6A is a cross-sectional view taken along line IV-IV of FIG. 2.
Figure 6B:
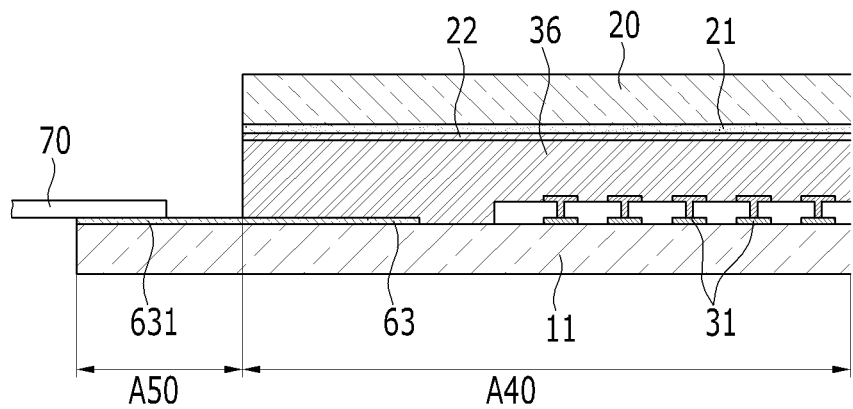
FIG. 6B is a cross-sectional view taken along line IV-IV of FIG. 2, as a variation of FIG. 6A.

FIG. 6A is a cross-sectional view taken along line IV-IV of FIG. 2 and FIG. 6B is a cross-sectional view taken along line IV-IV of FIG. 2, as a variation of FIG. 6A.

Referring to FIG. 6A, a second conductive member 37 may be positioned between the first conductive layer 22 and the base substrate 11 at both edges of the first conductive layer 22 which face the pad region A50. Further, a first inner wire layer 63 may be formed on the base substrate 11 facing the second conductive member 37 and connected with a second pad electrode 631 formed in the pad region A50. The second conductive member 37 may be made of a conductive sealing material at substantially the same height as the first conductive member 36.

A conductive path is formed through the second pad electrode 631, the first inner wire layer 63, the second conductive member 37, the first conductive layer 22, the first conductive member 36, and the first common power line 31 and the second common power line 32, and driving power can be applied from the flexible printed circuit 70 or a chip-on film (not shown) to the first and second common power lines 31, 32.

Referring to FIG. 6B, the first conductive member 36 extends to both edges of the first conductive layer 22 which face the pad region A50. In this configuration, the first conductive member 36 has a U-shape in the plan view, similar to the first conductive layer 22. The first inner wire layer 63 overlapping the first conductive member 63 may be formed on the base substrate 11 and connected with the second pad electrode 631 formed in the pad region A50.

A conductive path is formed through the second pad electrode 631, the first inner wire layer 63, the first conductive member 36, the first conductive layer 22, and the first common power line 31 and the second common power line 32, and driving power can be applied to the first and second common power lines 31, 32 from the flexible printed circuit 70 or the chip-on film (not shown).

FIG. 7 is a cross-sectional view taken along line V-V of FIG. 2.

Referring to FIGS. 2 and 7, the common electrode 43 may have a predetermined step, such as a convexo-concave structure, in the display area DA and the prominence of the common electrode 43 may be in close contact with the second conductive layer 23 formed on the encapsulation substrate 20. The common electrode 43 may thus be electrically connected with the second conductive layer 23 and may receive driving power therefrom.

The convexo-concave structure of the common electrode 43 may be implemented by spacers 71. A plurality of spacers 71 having a predetermined height may be formed on the pixel defining layer 19 and the common electrode 43 may be formed over the entire display area DA to cover the spacers 71, such that the common electrode 43 may have prominences having a height corresponding to spacers 71. The common electrode 43 may be pressed and electrically connected to the second conductive layer 23 if the base substrate 11 and the encapsulation substrate 20 are pressed together.

The spacers 71 may be uniformly distributed at a predetermined distance from each other over the entire display area DA. The prominences of the common electrode 43 may also be uniformly distributed over the entire display area DA, such that the common electrode 43 may be in uniformly close contact with the second conductive layer 23 throughout a large contact area.

A second inner wire layer 64 may be formed in the first wire region A10 contacting the pad region A50 and a third conductive member 38 may be formed between the second inner wire layer 64 and the second conductive layer 23. The second inner wire layer 64 may be connected with a third pad region 641 of the pad region A50. The third conductive member 38 may be made of a conductive sealing material at the same height as the first conductive member 36.

A conductive path is formed through the third pad electrode 641, the second inner wire layer 64, the third conductive member 38, the second conductive layer 23, and the common electrode 43 and driving power can be applied to the common electrode 43 from the flexible printed circuit 70 or the chip-on film (not shown). In some embodiments, the second conductive layer 23, which is in close contact with the sealing member 15, may completely cover and protect the common electrode 43 inside the sealing member 15 and prevent water from permeating from the outside, and may effectively function as a metal encapsulation sealing the common electrode 43.

In some embodiments, it is possible to apply driving power to the first and second common power lines 31, 32 in the four directions, up-, down-, left-, and right-directions, without forming the pad region A50 at the four edges of the base substrate 11. It may also be possible to uniformly apply the driving power to the common electrode 43 throughout the display area DA, using the close contact between the common electrode 43 and the second conductive layer 23. As a result, the organic light emitting diode display 100 can have a large-area screen with luminance uniformity, with a relatively simple structure.

The base substrate 11 may be made of transparent glass or transparent plastic. In embodiments where the base substrate 11 is made of transparent plastic, the material may be any one of polyether sulfone, polyacrylate, polyether imide, polyethylene naphthalate, polyethylene terephthalate, poly phenylene sulfide, polyarylate, polyimide, polycarbonate, cellulose triacetate, and cellulose acetate propionate.

A plurality of processes may be performed to form the pixels 12 on the base substrate 11, in which heat is applied and the base substrate 11 is expanded by the heat. The expansion of the base substrate 11 reduces durability of the organic light emitting diode display 100 and accuracy of the display area DA. A material having low thermal expansion coefficient for the base substrate 11 is preferably selected. In embodiments where the base substrate 11 is made of glass or plastic, it has a thermal expansion coefficient of about $3*10^{-6}$/K to $4*10^{-6}$/K.

Figure 8:
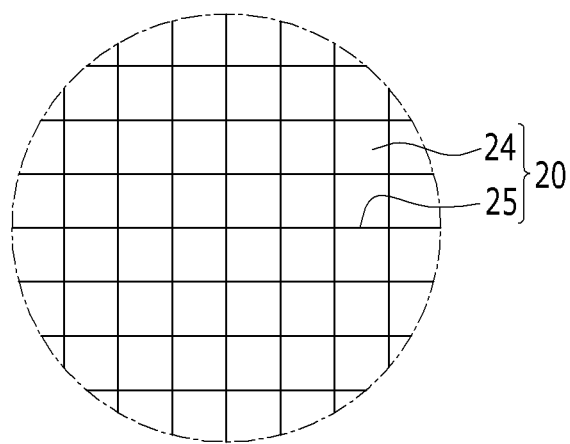
FIG. 8 is a schematic top plan view enlarging a portion of the encapsulation substrate shown in FIG. 4A.

FIG. 8 is a schematic top plan view enlarging a portion of the encapsulation substrate shown in FIG. 4A.

Referring to FIG. 8, the encapsulation substrate 20 may be formed of a carbon composite including a resin matrix 24 and a plurality of carbon fibers 25. The encapsulation substrate 20 may have a configuration in which the carbon fibers 25 are embedded in the resin matrix 24.

The carbon fibers 25 may have a thermal expansion coefficient smaller than that of the base substrate 11. The carbon fibers 25 have a negative thermal expansion coefficient in the length direction. The resin matrix 24 has a thermal expansion coefficient larger than the base substrate 11. Therefore, it is possible to control the thermal expansion coefficient of the encapsulation substrate 20 by adjusting the amount of carbon fibers 25 and resin matrix 24 relative to one another. It is possible to manufacture the encapsulation substrate 20 having a thermal expansion coefficient that is substantially the same as, or close to, that of the base substrate 11, by adjusting the ratio of the resin matrix 24 and the carbon fibers 25 during manufacturing of the encapsulation substrate 20.

The carbon fibers 25 do not absorb water, such that they increase the waterproof ability of the encapsulation substrate 20. An encapsulation substrate 20 including carbon fibers 25 has excellent mechanical properties, and enables achieving large mechanical rigidity even with a small thickness. The entire thickness of the organic light emitting diode display 100 may be reduced. The encapsulation substrate 20 may also prevent the first conductive layer 22 and the second conductive layer 23, which are formed of an aluminum layer or a copper layer, from being expanded by heat.

The carbon fibers 25 may be arranged to cross each other. In some embodiments, the carbon fibers 25 may be woven with wefts and wraps. In some embodiments, the carbon fibers 25 perpendicularly cross each other. In other embodiments, the carbon fibers 25 may cross each other at predetermined angles other than the right angle. The encapsulation substrate 20 may have a low thermal expansion coefficient throughout the region and the durability of the encapsulation substrate 20 may be increased.

When the base substrate 11 and the encapsulation substrate 20 are bonded by the sealing member 15 that is hardened by heat, the encapsulation substrate 20 may be expanded by the heat. When the encapsulation substrate 20 is largely expanded by the heat, the bonding with the base substrate 11 is weak, such that the durability of the organic light emitting diode display 100 decreases. However, since the encapsulation substrate 20 in certain embodiments is made of a carbon composite having a low thermal expansion coefficient, the amount of expansion in the heating process is relatively small, and accordingly, it is possible to increase the durability of the organic light emitting diode display 100.

Figure 9:
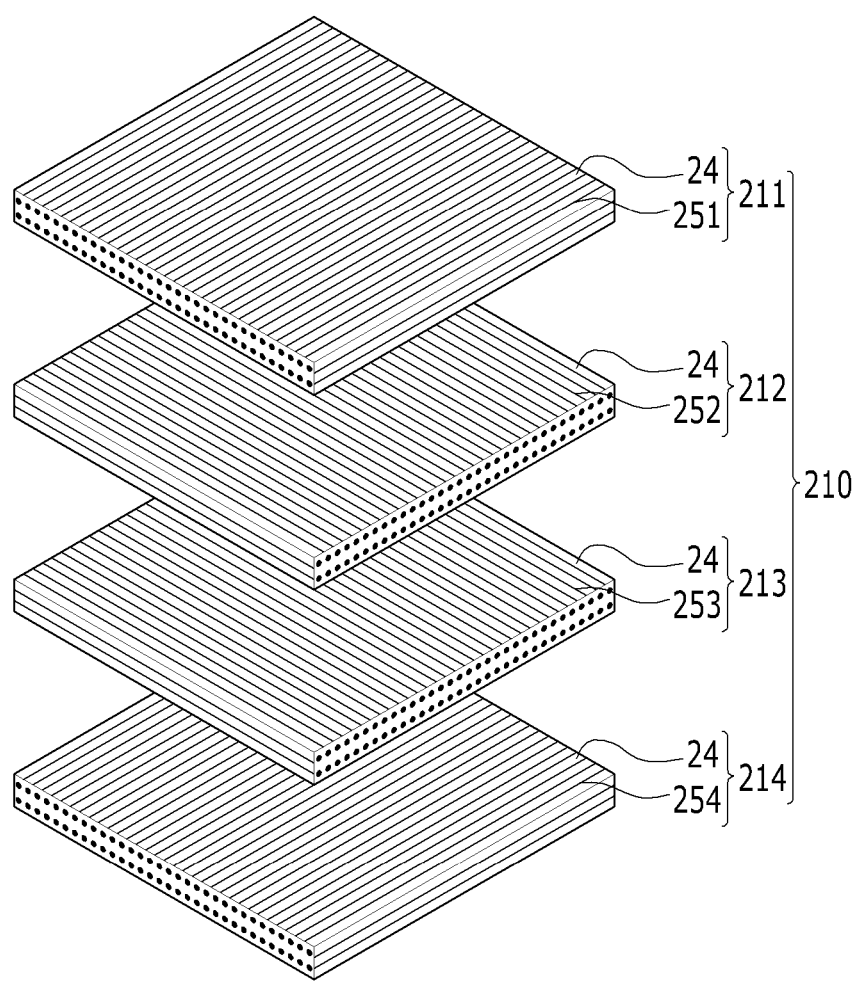
FIG. 9 is an exploded perspective view showing the encapsulation substrate shown in FIG. 4A, as an exemplary variation of FIG. 8.

FIG. 9 is an exploded perspective view showing the encapsulation substrate shown in FIG. 4A, as a variation of FIG. 8.

The encapsulation substrate 210 may be composed of a plurality of layers and each of the layers may include a resin matrix and a plurality of carbon fibers. The encapsulation substrate 210 may have a structure formed by stacking a first layer 211, a second layer 212, a third layer 213, and a fourth layer 214. The layers may each include a matrix 24 and a plurality of carbon fibers 251, 252, 253, 254.

The carbon fibers 251, 254 of the first layer 211 and the fourth layer 214 may be arranged in a first direction and the carbon fibers 252, 253 of the second layer 212 and the third layer 213 may be arranged in a second direction. The first direction and the second direction may cross at a right angle or at another angle. In the embodiment of FIG. 9, the first direction and the second direction cross at a right angle.

It is possible to variously set the angle between the direction of the carbon fibers 251, 254 in the first layer 211 and the fourth layer 214 and the direction of the carbon fibers 252, 253 in the second layer 212 and the third layer 213 in order to adjust the thermal expansion coefficient of the encapsulation substrate 210.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
a base substrate including a display area and a non-display area around the display area;
a plurality of pixels formed over the display area of the base substrate, the plurality of pixels comprising a common electrode;
a common power line formed over the base substrate and electrically connected to a circuit of each of the plurality of pixels;
an encapsulation substrate bonded to the base substrate by a sealing member surrounding the plurality of pixels, the encapsulation substrate comprising an inner surface facing the base substrate;
a first conductive layer formed over the inner surface and electrically connecting the common power line to a first potential; and
a second conductive layer formed over the inner surface and spaced apart from the first conductive layer, the second conductive layer electrically connecting the common electrode to a second potential.

2. The organic light emitting diode display of claim 1, wherein:
the encapsulation substrate comprises a material made of a carbon compound.

3. The organic light emitting diode display of claim 1, wherein:
the encapsulation substrate comprises a resin matrix and a plurality of carbon fibers, and
the carbon fibers are disposed to cross each other.

4. The organic light emitting diode display of claim 1, wherein:
the encapsulation substrate comprises a plurality of stacked layers, which comprises a first layer and a second layer, the first layer comprising a resin matrix and a plurality of carbon fibers aligned generally in a first direction, the second layer comprising a resin matrix and a plurality of carbon fibers aligned generally in a second direction crossing the first direction.

5. The organic light emitting diode display of claim 1, wherein:
an insulating layer is formed between the inner surface and the first conductive layer and further between the inner surface and the second conductive layer.

6. The organic light emitting diode display of claim 1, wherein:
the first conductive layer comprises an aluminum layer or a copper layer; and
the second conductive layer comprises an aluminum layer or a copper layer.

7. The organic light emitting diode display of claim 1, wherein:
the inner surface of the encapsulation substrate is generally rectangular,
the first conductive layer is formed along three edges of the inner surface.

8. The organic light emitting diode display of claim 7, wherein:
the common power line is electrically connected to the first conductive layer via a common power pad and a first conductive member.

9. The organic light emitting diode display of claim 8, wherein:
the first conductive member comprises a conductive sealing material and is interconnecting the base substrate and the encapsulation substrate along with the sealing member.

10. The organic light emitting diode display of claim 7, wherein:
the common electrode has a convexo-concave structure comprising a plurality of prominences facing the second conductive layer, wherein at least part of the prominences of the convexo-concave structure contact the second conductive layer.

11. The organic light emitting diode display of claim 10, wherein:
the base substrate comprises a plurality of spacers, which correspond to the plurality of prominences of the common electrode.

12. An organic light emitting diode display, comprising:
a base substrate including a non-display area and a display area, wherein the non-display area comprises a first wire region, a second wire region, a third wire region and a fourth wire region, each of which is extending along an edge of the display area, wherein the non-display area further comprises a pad region along the first wire region;
a plurality of pixels formed in the display area of the base substrate
a common power line formed in the display area of the base substrate, the common power line extending between the second wire region and the fourth wire region generally opposing the second wire region;
a common electrode formed in the display area of the base substrate and having a plurality of prominences;
an encapsulation substrate bonded to the base substrate by a sealing member surrounding the display area, the encapsulation substrate comprising a carbon compound, the encapsulation substrate comprising an inner surface facing the base substrate;
a first conductive layer formed over the inner surface in the second wire region, in the third wire region and in the fourth wire region, the first conductive layer electrically connected to the common power line; and
a second conductive layer formed over the inner surface and spaced apart from the first conductive layer, the second conductive layer electrically contacting at least part of the prominences of the common electrode.

13. The organic light emitting diode display of claim 12, wherein:
the encapsulation substrate comprises a resin matrix and a plurality of carbon fibers, and the carbon fibers are disposed to cross each other.

14. The organic light emitting diode display of claim 12, wherein:
the encapsulation substrate comprises a plurality of stacked layers, which comprises a first layer and a second layer, the first layer comprising a resin matrix and a plurality of carbon fibers aligned generally in a first direction, the second layer comprising a resin matrix and a plurality of carbon fibers aligned generally in a second direction crossing the first direction.

15. The organic light emitting diode display of claim 12, wherein:
an insulating layer is formed between the inner surface and the first conductive layer and further between the inner surface and the second conductive layer.

16. The organic light emitting diode display of claim 12, wherein:

each pixel of the plurality of pixels comprises a thin film transistor, wherein the thin film transistor comprises a semiconductor layer, a gate electrode disposed on the semiconductor layer with a gate insulating layer therebetween, and source and drain electrodes disposed on the gate electrode with an interlayer insulating layer therebetween.

17. The organic light emitting diode display of claim 16, wherein:
the common power line comprises the same material as at least one of the gate electrode, the source electrode, and the drain electrode.

18. The organic light emitting diode display of claim 12, wherein:
each of the pixels in the plurality of pixels comprises an organic light emitting diode, wherein the organic light emitting diode comprises a pixel electrode and an organic emission layer, and wherein the organic emission layer is interposed between the common electrode and the pixel electrode.

19. The organic light emitting diode display of claim 12, wherein the base substrate further comprises a gate insulating layer, an interlayer insulating layer, a planarization layer, at least one of which extends into the non-display area overlapping with one of the second wire region, the third wire region and the fourth wire region when viewed in a direction perpendicular to the inner surface, and wherein the at least one of the gate insulating layer, the interlayer insulating layer, and the planarization layer covers at least part of the common power line.

20. The organic light emitting diode display of claim 19, wherein the common power line is electrically connected to the first conductive layer via a wiring that extends in a direction substantially perpendicular to the inner surface, wherein the wiring comprises a common power pad that passes through at least one of the gate insulating layer, the interlayer insulating layer, and the planarization layer.

21. The organic light emitting diode display of claim 12, further comprising:
a pixel defining layer interposed between two immediately neighboring ones of the plurality of pixels;
at least one spacer protruding from the pixel defining layer toward the encapsulation substrate, and the common electrode covers the pixel defining layer and follows the contour of the at least one spacer to provide at least one prominence.

22. The organic light emitting diode display of claim 12, wherein:
the common power line includes a first common power line and a second common power line substantially perpendicular to the first common power line, and wherein opposing ends of the first common power line extend into the second wire region and the fourth wire region respectively, and wherein one end of the second common power line extends into the third wire region.

23. The organic light emitting diode display of claim 22, wherein:
a common power supply line is formed in a region surrounded by the sealing member, and wherein the other end of the second common power line is electrically connected to the common power supply line, and the common power supply line is connected to a first pad electrode in the pad region.

24. The organic light emitting diode display of claim 23, wherein:
a first conductive member extends to an edge of the first conductive layer which faces the pad region, a first inner wire layer overlapping the first conductive layer is formed on the base substrate, and the first inner wire layer is connected to a second pad electrode in the pad region.

25. The organic light emitting diode display of claim 24, wherein:
a second conductive member is positioned between the first conductive layer and the base substrate at the edge of the first conductive layer which faces the pad region, the first inner wire layer is formed on the base substrate along the second conductive member, and the first inner wire layer is connected with the second pad electrode in the pad region.

26. The organic light emitting diode display of any claim 12, wherein:
the second conductive layer faces the first wire region, the sealing member, and the display area.

27. The organic light emitting diode display of claim 25, wherein:
a second inner wire layer is formed in the first wire region on the base substrate, a third conductive member is positioned between the second inner wire layer and the second conductive layer, and the second inner wire layer is connected with a third pad electrode in the pad region.

\* \* \* \* \*